(12) United States Patent
Illiberi et al.

(10) Patent No.: US 11,965,238 B2
(45) Date of Patent: Apr. 23, 2024

(54) SELECTIVE DEPOSITION OF METAL OXIDES ON METAL SURFACES

(71) Applicant: ASM IP Holding B.V., Almere (NL)

(72) Inventors: Andrea Illiberi, Leuven (BE); Michael Eugene Givens, Helsinki (FI); Shaoren Deng, Ghent (BE); Giuseppe Alessio Verni, Antwerp (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 16/836,151

(22) Filed: Mar. 31, 2020

(65) Prior Publication Data
US 2020/0325573 A1 Oct. 15, 2020

Related U.S. Application Data

(60) Provisional application No. 62/833,256, filed on Apr. 12, 2019.

(51) Int. Cl.
*C23C 16/04* (2006.01)
*C23C 16/40* (2006.01)
*C23C 16/455* (2006.01)

(52) U.S. Cl.
CPC ............ *C23C 16/04* (2013.01); *C23C 16/403* (2013.01); *C23C 16/45525* (2013.01)

(58) Field of Classification Search
CPC . C23C 16/04; C23C 16/45525; C23C 16/403; H01L 21/02172; H01L 21/0228
See application file for complete search history.

(56) References Cited

U.S. PATENT DOCUMENTS

| | | | |
|---|---|---|---|
| 4,804,640 A | 2/1989 | Kaganowicz |
| 4,863,879 A | 9/1989 | Kwok |
| 4,948,755 A | 8/1990 | Mo |
| 5,288,697 A | 2/1994 | Schrepp et al. |
| 5,447,887 A | 9/1995 | Filipiak et al. |
| 5,604,153 A | 2/1997 | Tsubouchi et al. |
| 5,633,036 A | 5/1997 | Seebauer et al. |
| 5,869,135 A | 2/1999 | Vaeth et al. |
| 5,925,494 A | 7/1999 | Horn |

(Continued)

FOREIGN PATENT DOCUMENTS

| | | |
|---|---|---|
| CN | 111816547 | 10/2020 |
| EP | 0469456 A1 | 2/1992 |

(Continued)

OTHER PUBLICATIONS

Priimagi et al ("The Halogen Bond in the Design of Function Supramolecular Molecules: Recent Advances", Priimagi et al., Accounts of Chemical Research pp. 2686-2695, 2013, vol. 46 No. 11) (Year: 2013).*

(Continued)

*Primary Examiner* — Michael G Miller
(74) *Attorney, Agent, or Firm* — Banner & Witcoff, Ltd.

(57) ABSTRACT

Methods for selective deposition of metal oxide films on metal or metallic surfaces relative to oxide surfaces are provided. An oxide surface of a substrate may be selectively passivated relative to the metal or metallic surface, such as by exposing the substrate to a silylating agent. A metal oxide is selectively deposited from vapor phase reactants on the metal or metallic surface relative to the passivated oxide surface.

20 Claims, 1 Drawing Sheet

(56) References Cited

U.S. PATENT DOCUMENTS

| | | | |
|---|---|---|---|
| 6,046,108 A | 4/2000 | Liu et al. |
| 6,416,577 B1 | 7/2002 | Suntoloa et al. |
| 6,426,015 B1 | 7/2002 | Xia et al. |
| 6,455,414 B1 | 9/2002 | Hillman et al. |
| 6,482,740 B2 | 11/2002 | Soininen et al. |
| 6,586,330 B1 | 7/2003 | Ludviksson et al. |
| 6,679,951 B2 | 1/2004 | Soininen et al. |
| 6,759,325 B2 | 7/2004 | Raaijmakers et al. |
| 6,811,448 B1 | 11/2004 | Paton |
| 6,844,258 B1 | 1/2005 | Fair et al. |
| 6,852,635 B2 | 2/2005 | Satta et al. |
| 6,858,533 B2 | 2/2005 | Chu et al. |
| 6,878,628 B2 | 4/2005 | Sophie et al. |
| 6,887,795 B2 | 5/2005 | Soininen et al. |
| 6,921,712 B2 | 7/2005 | Soininen et al. |
| 6,958,174 B1 | 10/2005 | Klaus et al. |
| 7,041,609 B2 | 5/2006 | Vaartstra |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,611,751 B2 | 11/2009 | Elers |
| 7,695,567 B2 | 4/2010 | Fu |
| 7,754,621 B2 | 7/2010 | Putkonen |
| 7,790,631 B2 | 9/2010 | Sharma et al. |
| 7,799,135 B2 | 9/2010 | Verghese et al. |
| 7,910,177 B2 | 3/2011 | Li |
| 7,914,847 B2 | 3/2011 | Verghese et al. |
| 7,927,942 B2 | 4/2011 | Raaijmakers |
| 7,951,637 B2 | 5/2011 | Weidman et al. |
| 7,955,979 B2 | 6/2011 | Kostamo et al. |
| 7,964,505 B2 | 6/2011 | Khandelwal et al. |
| 8,173,554 B2 | 5/2012 | Lee et al. |
| 8,293,597 B2 | 10/2012 | Raaijmakers |
| 8,293,658 B2 | 10/2012 | Shero et al. |
| 8,425,739 B1 | 4/2013 | Wieting |
| 8,466,052 B2 | 6/2013 | Baek et al. |
| 8,536,058 B2 | 9/2013 | Kostamo et al. |
| 8,623,468 B2 | 1/2014 | Lin et al. |
| 8,778,815 B2 | 7/2014 | Yamaguchi et al. |
| 8,890,264 B2 | 11/2014 | Dewey et al. |
| 8,956,971 B2 | 2/2015 | Haukka et al. |
| 8,962,482 B2 | 2/2015 | Albertson et al. |
| 8,980,418 B2 | 3/2015 | Darling et al. |
| 8,993,404 B2 | 3/2015 | Korbrinsky et al. |
| 9,067,958 B2 | 6/2015 | Romero |
| 9,112,003 B2 | 8/2015 | Haukka et al. |
| 9,129,897 B2 | 9/2015 | Pore et al. |
| 9,136,110 B2 | 9/2015 | Rathsack |
| 9,159,558 B2 | 10/2015 | Cheng et al. |
| 9,236,292 B2 | 1/2016 | Romero et al. |
| 9,257,303 B2 | 2/2016 | Haukka et al. |
| 9,312,131 B2 | 4/2016 | Bauer et al. |
| 9,349,687 B1 | 5/2016 | Gates et al. |
| 9,353,139 B2 | 5/2016 | Sundermeyer et al. |
| 9,455,138 B1 | 9/2016 | Fukazawa et al. |
| 9,490,145 B2 | 11/2016 | Niskanen et al. |
| 9,502,289 B2 | 11/2016 | Haukka et al. |
| 9,552,979 B2 | 1/2017 | Knaepen et al. |
| 9,679,808 B2 | 6/2017 | Haukka et al. |
| 9,786,491 B2 | 10/2017 | Suzuki et al. |
| 9,786,492 B2 | 10/2017 | Suzuki et al. |
| 9,803,277 B1 | 10/2017 | Longrie et al. |
| 9,805,974 B1 | 10/2017 | Chen et al. |
| 9,816,180 B2 | 11/2017 | Haukka et al. |
| 9,895,715 B2 * | 2/2018 | Haukka .................. C23C 18/06 |
| 9,911,595 B1 | 3/2018 | Smith et al. |
| 10,014,212 B2 | 7/2018 | Chen et al. |
| 10,041,166 B2 | 8/2018 | Longrie et al. |
| 10,047,435 B2 | 8/2018 | Haukka et al. |
| 10,049,924 B2 | 8/2018 | Haukka et al. |
| 10,115,603 B2 | 10/2018 | Niskanen et al. |
| 10,157,786 B2 | 12/2018 | Haukka et al. |
| 10,186,420 B2 | 1/2019 | Fukazawa |
| 10,204,782 B2 | 2/2019 | Maes et al. |
| 10,343,186 B2 | 7/2019 | Pore et al. |
| 10,373,820 B2 | 8/2019 | Tois et al. |
| 10,428,421 B2 | 10/2019 | Haukka et al. |
| 10,443,123 B2 | 10/2019 | Haukka et al. |
| 10,453,701 B2 | 10/2019 | Tois et al. |
| 10,480,064 B2 | 11/2019 | Longrie et al. |
| 10,546,741 B2 | 1/2020 | Muramaki et al. |
| 10,695,794 B2 | 6/2020 | Pore et al. |
| 10,847,363 B2 | 11/2020 | Tapily |
| 10,900,120 B2 | 1/2021 | Sharma et al. |
| 2001/0019803 A1 | 9/2001 | Mirkanimi |
| 2001/0021414 A1 | 9/2001 | Morishima et al. |
| 2001/0025205 A1 | 9/2001 | Chern et al. |
| 2002/0027261 A1 | 3/2002 | Blesser et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2002/0107316 A1 | 8/2002 | Bice et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0176559 A1 | 9/2003 | Bice et al. |
| 2003/0181035 A1 | 9/2003 | Yoon et al. |
| 2003/0185997 A1 | 10/2003 | Hsieh |
| 2003/0192090 P1 | 10/2003 | Meilland |
| 2003/0193090 A1 | 10/2003 | Otani et al. |
| 2004/0092073 A1 | 5/2004 | Cabral |
| 2004/0129558 A1 | 7/2004 | Liu et al. |
| 2004/0219746 A1 | 11/2004 | Vaartstra et al. |
| 2005/0012975 A1 | 1/2005 | George et al. |
| 2005/0112282 A1 | 5/2005 | Gordon et al. |
| 2005/0136604 A1 | 6/2005 | Al-Bayati et al. |
| 2005/0160575 A1 | 7/2005 | Gambino et al. |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0121271 A1 | 6/2006 | Frey et al. |
| 2006/0121677 A1 | 6/2006 | Parekh et al. |
| 2006/0121733 A1 | 6/2006 | Kilpela et al. |
| 2006/0128150 A1 | 6/2006 | Gandikota et al. |
| 2006/0141155 A1 | 6/2006 | Gordon et al. |
| 2006/0156979 A1 | 7/2006 | Thakur et al. |
| 2006/0176559 A1 | 8/2006 | Minoda et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0063317 A1 | 3/2007 | Kim et al. |
| 2007/0098894 A1 | 5/2007 | Verghese et al. |
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0032064 A1 | 2/2008 | Gordon et al. |
| 2008/0066680 A1 | 3/2008 | Sherman |
| 2008/0072819 A1 | 3/2008 | Rahtu |
| 2008/0124932 A1 | 5/2008 | Tateishi et al. |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0275163 A1 | 11/2009 | Lacey et al. |
| 2009/0311879 A1 | 12/2009 | Blasco et al. |
| 2010/0015756 A1 | 1/2010 | Weidman et al. |

(56) References Cited

U.S. PATENT DOCUMENTS

| | | |
|---|---|---|
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1 | 11/2010 | Dameron |
| 2010/0314765 A1 | 12/2010 | Liang et al. |
| 2011/0039420 A1 | 2/2011 | Nakao |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1 | 6/2011 | Haukka et al. |
| 2011/0146703 A1 | 6/2011 | Chen et al. |
| 2011/0198756 A1 | 8/2011 | Thenappan et al. |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0091541 A1 | 4/2012 | Suchomel et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0084700 A1 | 4/2013 | Swerts et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1* | 6/2013 | Vaidya ............... H01L 31/18 438/98 |
| 2013/0189790 A1 | 7/2013 | Li et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1 | 11/2013 | Rathsack et al. |
| 2013/0316080 A1 | 11/2013 | Yamaguchi et al. |
| 2013/0319290 A1 | 12/2013 | Xiao et al. |
| 2013/0323930 A1 | 12/2013 | Chattopadhyay et al. |
| 2013/0330936 A1* | 12/2013 | Lachaud ........... H01L 21/0226 438/787 |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0252487 A1 | 9/2014 | Stephens et al. |
| 2014/0272194 A1 | 9/2014 | Xiao et al. |
| 2014/0273290 A1 | 9/2014 | Somervell |
| 2014/0273477 A1 | 9/2014 | Niskanen et al. |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004317 A1 | 1/2015 | Dussarrat et al. |
| 2015/0004319 A1 | 1/2015 | Mizue |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1 | 8/2015 | Haukka et al. |
| 2015/0240121 A1 | 8/2015 | Sugita et al. |
| 2015/0275355 A1 | 10/2015 | Mallikarjunan et al. |
| 2015/0299848 A1 | 10/2015 | Haukka et al. |
| 2015/0371866 A1 | 12/2015 | Chen et al. |
| 2015/0372205 A1 | 12/2015 | Kimura et al. |
| 2015/0376211 A1 | 12/2015 | Girard et al. |
| 2016/0005731 A1* | 1/2016 | Chen ................... H01L 29/785 257/300 |
| 2016/0075884 A1 | 3/2016 | Chen |
| 2016/0079524 A1 | 3/2016 | Do et al. |
| 2016/0086850 A1 | 3/2016 | Romero et al. |
| 2016/0152640 A1 | 6/2016 | Kuchenbeiser et al. |
| 2016/0172189 A1 | 6/2016 | Tapily |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293384 A1 | 10/2016 | Yan et al. |
| 2016/0293398 A1 | 10/2016 | Danek et al. |
| 2016/0315191 A1 | 10/2016 | Tsai et al. |
| 2016/0346838 A1 | 12/2016 | Fujita et al. |
| 2016/0365280 A1 | 12/2016 | Brink et al. |
| 2017/0037513 A1* | 2/2017 | Haukka ................. C23C 16/04 |
| 2017/0040164 A1 | 2/2017 | Wang et al. |
| 2017/0051405 A1 | 2/2017 | Fukazawa et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0332179 A1 | 11/2017 | Bright et al. |
| 2017/0352533 A1 | 12/2017 | Tois et al. |
| 2017/0352550 A1 | 12/2017 | Tois et al. |
| 2017/0358482 A1 | 12/2017 | Chen et al. |
| 2018/0010247 A1 | 1/2018 | Niskanen et al. |
| 2018/0040708 A1 | 2/2018 | Narayanan et al. |
| 2018/0073136 A1 | 3/2018 | Haukka et al. |
| 2018/0080121 A1 | 3/2018 | Longrie et al. |
| 2018/0096888 A1 | 4/2018 | Naik et al. |
| 2018/0142348 A1 | 5/2018 | Yu et al. |
| 2018/0151345 A1* | 5/2018 | Haukka ............. C23C 16/45525 |
| 2018/0151355 A1 | 5/2018 | Fukazawa |
| 2018/0182618 A1 | 6/2018 | Blanquart et al. |
| 2018/0222933 A1 | 8/2018 | Romero |
| 2018/0233350 A1* | 8/2018 | Tois ................. H01L 23/53238 |
| 2018/0243787 A1 | 8/2018 | Haukka et al. |
| 2018/0350587 A1 | 12/2018 | Jia et al. |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0100837 A1 | 4/2019 | Haukka et al. |
| 2019/0155159 A1 | 5/2019 | Knaepen et al. |
| 2019/0283077 A1 | 9/2019 | Pore et al. |
| 2019/0333761 A1 | 10/2019 | Tois et al. |
| 2019/0341245 A1 | 11/2019 | Tois et al. |
| 2020/0051829 A1 | 2/2020 | Tois et al. |
| 2020/0090924 A1 | 3/2020 | Wu et al. |
| 2020/0105515 A1 | 4/2020 | Maes et al. |

(56) References Cited

U.S. PATENT DOCUMENTS

| | | | |
|---|---|---|---|
| 2020/0325573 | A1 | 10/2020 | Illiberi et al. |
| 2020/0395211 | A1 | 12/2020 | Jia et al. |

FOREIGN PATENT DOCUMENTS

| | | |
|---|---|---|
| EP | 0880168 A2 | 11/1998 |
| EP | 1340269 | 2/2009 |
| EP | 3026055 | 6/2016 |
| JP | 2001127068 | 5/2001 |
| JP | 2008311603 | 12/2008 |
| JP | 2010540773 A | 12/2010 |
| JP | 2011018742 | 1/2011 |
| JP | 2011-187583 | 9/2011 |
| JP | 2014-93331 | 5/2014 |
| JP | 201811057 A | 1/2018 |
| KR | 102001001072 | 2/2001 |
| KR | 1020020010821 | 2/2002 |
| KR | 20030027392 | 4/2003 |
| KR | 1020040056026 | 6/2004 |
| KR | 1020050103811 | 11/2005 |
| KR | 10-0920033 | 10/2009 |
| KR | 10-2010-0093859 | 8/2010 |
| KR | 10-2020-0120872 | 10/2020 |
| KR | 10-2197048 | 12/2020 |
| TW | 2005-39321 | 12/2005 |
| TW | 2010-05827 | 2/2010 |
| TW | 2010-27766 | 7/2010 |
| TW | 2014-39365 | 10/2014 |
| TW | 1652734 | 3/2019 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 2016/178978 | 11/2016 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

Ma ("Tuning the moisture stability of metal-organic frameworks by incorporating hydrophobic functional groups at different positions of ligands", Ma et al, Chem. Commun,. 2011, 47, 7377-7379) (Year: 2011).*
File History of U.S. Appl. No. 16/987,990, filed Aug. 7, 2020.
File History of U.S. Appl. No. 17/135,001, filed Dec. 28, 2020.
File History of U.S. Appl. No. 17/113,383, filed Dec. 7, 2020.
File History of U.S. Appl. No. 17/064,865, filed Oct. 7, 2020.
Aaltonen et al., "Atomic Layer Deposition of Iridium Thin Films", Journal of The Electrochemical Society, 151 (8) G489-G492 (2004).
Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.
Benzotriazole, Wikipedia via https://en.wikipedia.org/wiki/Benzotriazole; pp. 1-5, no date available.
Bernal-Ramos, et al., "Atomic Layer Deposition of Cobalt Silicide Thin Films Studied by in Situ Infrared Spectroscopy", Chem. Mater. 2015, 27, pp. 4943-4949.
Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.
Burton, B.B. et al., "Atomic Layer Deposition of MgO Using Bis(ethylcyclopentadienyl)magnesium and H20". J. Phys. Chem. C, 2009, 113, 1939-1946.

Burton, B.B., et al., "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.
Carlsson, J., "Precursor Design for Chemical Vapour Deposition", Acta Chemica Scandinavica, vol. 45, 1991, pp. 864-869.
Chang et al., "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.
Chen et al., Highly Stable Monolayer Resists for Atomic Layer Deposition on Germanium and Silicon, Chem. Matter, vol. 18, No. 16, pp. 3733-3741, 2006.
Cho et al., "Atomic layer deposition of $Al_2O_3$ thin films using dimethylaluminum isopropoxide and water", Journal of Vacuum Science & Technology A 21, (2003), doi: 10.1116/1.1562184, pp. 1366-1370.
Coclite, et al.; 25th Anniversary Article: CVD Polymers: A New Paradigm for Surface Modification and Device Fabrication; Advanced Materials; Oct. 2013; 25; pp. 5392-5423.
Elam et al., "Kinetics of the WF6 and Si2H6 surface reactions during tungsten atomic layer deposition", Surface Science, vol. 479, 2001, pp. 121-135.
Elam et al., "Nucleation and growth during tungsten atomic layer deposition on SiO2 surfaces", Thin Solid Films, vol. 386, 2001 pp. 41-52.
Ellinger et al., "Selective Area Spatial Atomic Layer Deposition of ZnO, Al2O3, and Aluminum-Doped ZnO Using Poly(vinyl pyrolidone)", Chem. Mater. 2014, 26, pp. 1514-1522.
Fabreguette et al., Quartz crystal microbalance study of tungsten atomic layer deposition using WF6 and Si2H6, Thin Solid Films, vol. 488, 2005, pp. 103-110.
Farm et al. Selective-Area Atomic Layer Deposition Using Poly( methyl methacrylate) Films as Mask Layers, J. Phys. Chem. C, 2008, 112, pp. 15791-15795. (Year: 2008).
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.
File History of U.S. Appl. No. 14/612,784, filed Feb. 3, 2015.
File History of U.S. Appl. No. 15/877,632, filed Jan. 23, 2018.
File History of U.S. Appl. No. 16/657,307, filed Oct. 18, 2019.
File History of U.S. Appl. No. 14/687,833, filed Apr. 15, 2015.
File History of U.S. Appl. No. 16/100,855, filed Aug. 10, 2018.
File History of U.S. Appl. No. 16/594,365, filed Oct. 7, 2019.
File History of U.S. Appl. No. 14/628,799, filed Feb. 23, 2015.
File History of U.S. Appl. No. 15/331,366, filed Oct. 21, 2016.
File History of U.S. Appl. No. 16/143,888, filed Sep. 27, 2018.
File History of U.S. Appl. No. 14/817,161, filed Aug. 3, 2015.
File History of U.S. Appl. No. 14/819,274, filed Aug. 5, 2015.
File History of U.S. Appl. No. 16/787,672, filed Feb. 11, 2020.
File History of U.S. Appl. No. 15/432,263, filed Feb. 14, 2017.
File History of U.S. Appl. No. 16/158,780, filed Oct. 12, 2018.
File History of U.S. Appl. No. 16/773,064, filed Jan. 27, 2020.
File History of U.S. Appl. No. 15/221,453, filed Jul. 27, 2016.
File History of U.S. Appl. No. 16/575,112, filed Sep. 18, 2019.
File History of U.S. Appl. No. 15/177,195, filed Jun. 8, 2016.
File History of U.S. Appl. No. 15/795,768, filed Oct. 27, 2017.
File History of U.S. Appl. No. 16/040,844, filed Jul. 20, 2018.
File History of U.S. Appl. No. 16/676,017, filed Nov. 6, 2019.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
File History of U.S. Appl. No. 16/605,475, filed Oct. 15, 2019.
File History of U.S. Appl. No. 16/033,952, filed Jul. 12, 2018.
File History of U.S. Appl. No. 16/399,328, filed Apr. 30, 2019.
File History of U.S. Appl. No. 15/971,601, filed May 4, 2018.
File History of U.S. Appl. No. 16/588,600, filed Sep. 30, 2019.
File History of U.S. Appl. No. 13/708,863, filed Dec. 7, 2012.
File History of U.S. Appl. No. 14/737,293, filed Jun. 11, 2015.

(56) References Cited

OTHER PUBLICATIONS

File History of U.S. Appl. No. 15/356,306, filed Nov. 18, 2016.
File History of U.S. Appl. No. 16/213,479, filed Dec. 7, 2018.
File History of U.S. Appl. No. 13/702,992, filed Mar. 26, 2013.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.
Formic Acid, Wikipedia via https://en.wikipedia.org/wiki/Formic_acid; pp. 1-5, no date available.
George, Steven M., "Atomic Layer Deposition: An Overview", Chem. Rev. 2010, 110, pp. 111-113.
Ghosal et al., Controlling Atomic Layer Deposition of TiO2 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.
Hymes et al., "Surface cleaning of copper by thermal and plasma treatment in reducing and inert ambients", J. Vac. Sci. Technol. B, vol. 16, No. 3, May/Jun. 1998, pp. 1107-1109.
International Search Report and Written Opinion dated Feb. 17, 2012 in Application No. PCT/US2011/039970, filed Jun. 10, 2011.
International Search Report and Written Opinion dated Aug. 8, 2018 in Application No. PCT/US2018/030974, filed May 3, 2018.
International Search Report and Written Opinion dated Jul. 24, 2018 in Application No. PCT/US2018/030979, filed May 3, 2018.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Lee et al., Area-Selective Atomic Layor Deposition Using Self-Assembled Monolayer and Scanning Probe Lithography, Journal of The Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.
Lemonds, A.M., "Atomic layer deposition of TaSix thin films on SiO2 using TaF5 and Si2H6", Thin Solid Films 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.

Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1-116102-3, 2010.
Mackus et al., "The use of atomic layer deposition in advanced nanopatterning", Nanoscale, 2014, 6, pp. 10941-10960.
Maluf et al., "Selective tungsten filling of sub-0.25 μm trenches for the fabrication of scaled contacts and x-ray masks", J. Vac. Sci. Technol. B, vol. 8, No. 3, May/Jun. 1990, pp. 568-569.
Norrman, et al.; 6 Studies Of Spin-Coated Polymer Films; Annu. Rep. Prag. Chem.; Sect. C; 2005; 101; pp. 174-201.
Office Action dated Jun. 8, 2017 in Korean Application No. 2013-7000596.
Overhage et al., Selective Atomic Layer Deposition (SALD) of Titanium Dioxide on Silicon and Copper Patterned Substrates, Journal of Undergraduate Research 4, 29, Mar. 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, pp. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition Of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeiber, Decomposition of formic acid, Chemnitz University of Technology, pp. 1-13, Aug. 31, 2011.
Schmeißer, Reduction of Copper Oxide by Formic Acid an ab-initio study, Chemnitz University of Technology, pp. 1-42, Sep. 2011.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Schuiskly et al., "Atomic Layer Deposition of Thin Films Using O2 as Oxygen Source", Langmuir, vol. 17, No. 18, 2001, pp. 5508-5512.
Sundberg, et al.; Organic And Inorganic-Organic Thin Film Structures By Molecular Layer Deposition: A Review; Beilstein J. Nanotechnol; 2014, 5, pp. 1104-1136.
Suntola, Tuomo, "Thin Films and Epitaxy Part B: Grown mechanism and Dynamics", Handbook of Crystal Growth vol. 3, Elsevier, 1994, 33 pages.

(56) References Cited

OTHER PUBLICATIONS

Ting, et al., "Selective Electroless Metal Deposition for Integrated Circuit Fabrication", J. Electrochem. Soc., vol. 136, No. 2, Feb. 1989, pp. 456-462.

Toirov, et al.; Thermal Cyclodehydration of Polyamic Acid Initiated by UV-Irradiation; Iranian Polymer Journal; vol. 5, No. 1; pp. 1A323:C3286-22; 1996; Iran.

"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.

Vervuurt et al., "Area-selective atomic layer deposition of platinum using photosensitive polyimide", Nanotechnology 27, 2016, in 6 pages.

Zhou, et al.; Fabrication Of Organic Interfacial Layers By Molecular Layer Deposition: Present Status And Future Opportunities; Journal of Vacuum Science & Technology; A 31 (4), 040801-1 to 040801-18; 2013.

Hu et al. "Coating strategies for atomic layer deposition", Nanotechnol. Rev. 2017; 6(6): pp. 527-547.

Lin et al., "Selective Deposition of Multiple Sensing Materials on Si Nanobelt Devices through Plasma-Enhanced Chemical Vapor Deposition and Device-Localized Joule Heating", ACS Appl. Mater. Interfaces 2017, 9, 39935-39939, DOI: 10.1021/acsami.7b13896.

Wang et al., "Low-temperature plasma-enhanced atomic layer deposition of tin oxide electron selective layers for highly efficient planar perovskite solar cells", Journal of Materials Chemistry A, 2016, 4, pp. 12080-12087.

Burton et al., "Rapid SiO2 Atomic Layer Deposition Using Tris(tert-pentoxy)silanol", Chem. Mater. 2008, 20, pp. 7031-7043.

Cai et al., "Selective Passivation of Pt Nanoparticles with Enhanced Sintering Resistance and Activity toward CO Oxidation via Atomic Layer Deposition", ACS Appl. Nano Mater. 2018, 1, 2, pp. 522-530.

Choi et al., "Rapid vapor deposition SiO2 thin film deposited at a low temperature using tris(tert-pentoxy)silanol and trimethyl-aluminum", Materials Chemistry and Physics, 142 (2013), pp. 614-618.

Hausmann et al., "Rapid Vapor Deposition of Highly Conformal Silica Nanolaminates", Science, vol. 298, Oct. 11, 2002, pp. 402-406.

Mameli et al., Area-Selective Atomic Layer Deposition of SiO2 Using Acetylacetone as a Chemoselective Inhibitor in an ABC-Type Cycle, ACS Nano, Aug. 29, 2017, 9303-9311, 11, 9, American Chemical Society.

Soethoudt et al., "Impact of SiO2 surface composition on trimethylsilane passivation for area-selective deposition", J. Mater. Chem. C, 2019, 7, pp. 11911-11918.

Tomczak, Y., In Situ Reaction Mechanism Studies on Atomic Layer Deposition of AlxSiyOz from Trimethylaluminium, Hexakis(ethylamino)disilane, and Water, Chem. Mater., Oct. 12, 2012, 3859-3867, 24, American Chemical Society.

\* cited by examiner

SELECTIVE DEPOSITION OF METAL OXIDES ON METAL SURFACES

REFERENCE TO RELATED APPLICATION

This application claims priority to U.S. Provisional application No. 62/833,256, filed Apr. 12, 2019, which is incorporated by reference herein.

BACKGROUND

Field

The present disclosure relates generally to selective deposition of metal oxides on a first metal or metallic surface of a substrate relative to a second dielectric surface of the substrate.

Description of the Related Art

The shrinking device dimensions in semiconductor manufacturing call for new innovative processing approaches. Conventionally, patterning in semiconductor processing involves subtractive processes, in which blanket layers are deposited, masked by photolithographic techniques, and etched through openings in the mask. Additive patterning is also known, in which masking steps precede deposition of the materials of interest, such as patterning using lift-off techniques or damascene processing. In most cases, expensive multi-step lithographic techniques are applied for patterning.

Patterning could be simplified by selective deposition, which has received increasing interest among semiconductor manufacturers. Selective deposition would be highly beneficial in various ways. Significantly, it could allow a decrease in lithography steps, reducing the cost of processing. Selective deposition could also enable enhanced scaling in narrow structures.

SUMMARY

In some aspects, methods of selectively depositing metal oxide on a metal surface of a substrate relative to an dielectric surface, such as an oxide surface, are provided. In some embodiments the dielectric surface is selectively passivated relative to the metal surface and the metal oxide is selectively deposited on the metal surface relative to the passivated dielectric surface from vapor phase reactants. In some embodiments the metal surface comprises Al, Cu, Co, Ni, W, Nb, Fe or Mo. In some embodiments the dielectric surface comprises a dielectric transition metal oxide. In some embodiments the dielectric surface comprises aluminum oxide, zirconium oxide, hafnium oxide, titanium oxide, tantalum oxide, yttrium oxide, or lanthanum oxide.

In some embodiments selectively passivating the dielectric surface, such as an oxide surface, comprises exposing the dielectric surface to a silylation agent. In some embodiments the silylation agent is an alkylaminosilane. In some embodiments the silylation agent is a silane. In some embodiments the silylation agent comprises allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA).

In some embodiments the dielectric surface comprises aluminum oxide. The aluminum oxide may be deposited using an aluminum precursor comprising trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA) or triethyl aluminum (TEA). In some embodiments the aluminum oxide is deposited using a heteroleptic aluminum compound comprising an alkyl group and a different ligand, such as a halide. In some embodiments aluminum oxide is deposited by ALD using an aluminum precursor and water.

In some embodiments a passivation blocking layer is formed on the metal surface prior to selectively passivating the dielectric surface. Such a passivation blocking layer may comprise, for example, a self-assembled monolayer (SAM).

DETAILED DESCRIPTION

Metal oxide can be selectively deposited over a first metal (or metallic) surface relative to a second dielectric surface, such as an oxide surface. In some embodiments the oxide surface is adjacent to the metal surface. In embodiments described herein, the oxide surface may be selectively passivated relative to the metal surface, for example by silylation. Subsequently, a metal oxide layer is selectively deposited on the metal surface relative to the passivated oxide surface. The metal oxide layer may be deposited by a vapor deposition process, such as an atomic layer deposition process. In some embodiments an oxide surface on a substrate is silylated with a silylating agent such as allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA), and a metal oxide is subsequently selectively deposited on a metal surface of the substrate relative to the passivated oxide surface. In some embodiments the metal oxide layer may be an aluminum oxide layer, such as an $Al_2O_3$ layer. For example, an aluminum oxide layer may be selectively deposited by an ALD process, for example using an aluminum reactant such as trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA) or triethyl aluminum (TEA) and water as reactants.

In some embodiments a metal or metallic surface of a substrate comprises an elemental metal or metal alloy, while a second, different surface of the substrate comprises a dielectric material, such as an oxide. Examples include silicon oxide-based materials, including grown or deposited silicon dioxide, doped and/or porous oxides, native oxide on silicon, etc. The surface of the dielectric layer is selectively passivated relative to the metal or metallic surface, such as by selective silylation. Subsequently, a metal oxide layer is selectively deposited on the metal or metallic surface relative to the passivated dielectric surface. Examples of the metal oxide that may be deposited include dielectrics, such as zirconium oxide (e.g., $ZrO_2$), hafnium oxide (e.g., $HfO_2$), aluminum oxide (e.g. $Al_2O_3$), titanium nitride (e.g., TiN) and titanium oxide (e.g. $TiO_2$). In some embodiments the metal or metallic surface on which the metal oxide is selectively deposited is at least partially adjacent to the dielectric surface that is selectively passivated. For example, at least one portion of a metal or metallic surface may be adjacent to an oxide surface.

In some embodiments, prior to forming the passivation layer on the dielectric surface, such as an oxide surface, the metal or metallic surface can be provided with a passivation blocking layer, such as a self-assembled monolayer (SAM). The passivation blocking layer may facilitate selectivity for the silylation of the dielectric surface, and can be removed thereafter to permit selective deposition of a metal oxide on the metal or metallic surface relative to the silylated dielectric surface.

The passivation layer (silylation) may be removed from the dielectric surface, such as from an oxide surface, following selective deposition of the metal oxide layer over the metal or metallic surface. Conditions may be chosen to avoid damage to surrounding materials on the substrate.

Examples of suitable reactors that may be used in the selective deposition processes described herein include commercially available ALD equipment. In addition to ALD reactors, many other kinds of reactors capable growth of organic passivation layers, including CVD reactors, VDP reactors, and MLD reactors, can be employed.

Substrate Surfaces

According to some aspects of the present disclosure, selective deposition can be used to deposit films of interest, such as metal oxide films, on a metal or metallic surface preferentially relative to an oxide surface, or other dielectric surface. In some embodiments the two surfaces are at least partially adjacent to each other on the substrate. Selective passivation of the oxide surface, such as selective silylation of the oxide surface, relative to the metal or metallic surface, facilitates subsequent selective deposition of a layer of interest, such as a metal oxide layer, on the metal or metallic surface relative to the silylated oxide surface.

For example, one of the surfaces can be a conductive metal or metallic surface of a substrate, while the other surface can be a non-conductive oxide surface of the substrate. In some embodiments, the non-conductive surface comprises —OH groups, such as a silicon oxide-based surface (e.g., low-k materials, including grown and deposited silicon-oxide materials and native oxide over silicon). The oxide surface can be selectively passivated relative to the metal or metallic surface by exposure to a silylating agent and a metal oxide can be subsequently selectively deposited on the metal or metallic surface relative to the silylated oxide surface.

The material differences between the two substrate surfaces are such that vapor deposition methods can selectively passivate the oxide surface relative to the metal or metallic surface. In some embodiments, cyclical vapor deposition is used, for example, cyclical CVD or atomic layer deposition (ALD) processes. In some embodiments, selectivity for the passivation layer can be achieved without passivation/blocking agents on the metal or metallic surface (to receive less of the passivation layer), and/or without catalytic agents on the surface of the oxide layer to receive more of the passivation layer. For example, in embodiments where the first surface is metallic and the second surface is an oxide, the oxide layer can be selectively silylated relative to the metal or metallic surface without pretreatment of the oxide surface or the metal or metallic surface. In other embodiments, the metal or metallic surface is first treated to inhibit passivation (such as silylation) of that surface. For example, a passivation blocking self-assembled monolayer (SAM) can be first formed over a metal or metallic surface relative to an oxide surface, facilitating selective deposition of a passivation layer on the oxide surface relative to the SAM-covered metallic surface. The passivation inhibitor can be removed after selective passivation and prior to deposition of the metal oxide. After selective deposition of the passivation layer is completed, selective deposition of materials of interest, such as metal oxide, can be conducted on the non-passivated metal or metallic surface relative to the passivated surface.

As used herein, unless otherwise specified if a surface is referred to as a metal surface herein, it may be a metal surface or a metallic surface. In some embodiments, the metal or metallic surface may comprise surface oxidation. In some embodiments, the material of the metal surface is electrically conductive with or without surface oxidation. In some embodiments, a metal surface comprises one or more transition metals. In some embodiments, a metal surface comprises one or more of Al, Cu, Co, Ni, W, Nb, Fe, or Mo. In some embodiments a metal surface comprises Cu. In some embodiments a metal surface is a copper surface. In some embodiments, a metallic surface comprises titanium nitride. In some embodiments, the metal surface comprises one or more noble metals, such as Ru. In some embodiments, the metal surface comprises a metal oxide, such as a conductive metal oxide, metal nitride, carbide, boride, or combination thereof. For example, the metal or metallic surface may comprise one or more of $RuO_x$, $NbC_x$, $NbB_x$, $NiO_x$, $CoO_x$, $NbO_x$, $MoO_x$, $WO_x$, $WNC_x$, TaN, or TiN.

In some embodiments, the metal or metallic surface is a surface that can accept or coordinate with a precursor utilized in a selective deposition process of the layer of interest, such as a metal oxide, as described herein.

As mentioned above, in some embodiments, the metal or metallic surface may comprise a passivation block layer thereover. That is, in some embodiments, the metal or metallic surface may comprise a material that inhibits formation of a passivation layer on the metal or metallic surface, for example a self-assembled monolayer (SAM). In some embodiments a deposition process includes forming the passivation block layer on the metal or metallic surface but not on the surface to be passivated.

Passivation of Substrate Surfaces

In some embodiments the oxide (or other dielectric) surface may be passivated. In some embodiments, the passivation is selective for the oxide surface relative to another surface, such as a metal or metallic surface on the same substrate. In some embodiments the oxide surface is silylated by exposure to a vapor phase silylation agent one or more times. For example, in a passivation step a silylation agent may be conducted in to the reaction space and contacted with the oxide surface. The silylating agent may be, for example, a chlorosilane, alkoxysilane, silylhalide, silylcyanate, silazide, silylisocyanate, silylisothiocyanate, silylsulfonate, silylacetamide, silylcarbodiimide, allysilane, or nitrogen-bearing silane such as a silazane, imidazole or amine. In some embodiments the silylation agent is allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA) and silylation comprises exposing the substrate to one or more pulses of the silylating agent. In some embodiments both the metal or metallic surface and oxide surface are contacted with the silylation agent, such as allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA). In some embodiments the oxide surface of a substrate is selectively silylated relative to a metal or metallic surface of the substrate.

In some embodiments the silylation agent is an alkylaminosilane. For example, the oxide surface of the substrate may be contacted with an alkylaminosilane having the formula $(R^I)_3Si(NR^{II}R^{III})$, wherein $R^I$ is a linear or branched C1-C5 alkyl group or a linear or branched C1-C4 alkyl group, $R^{II}$ is a linear or branched C1-C5 alkyl group, a linear or branched C1-C4 alkyl group, or hydrogen, and $R^{III}$ is a linear or branched C1-C5 alkyl group or a linear or branched C1-C4 alkyl group.

In some embodiments the silylation agent is a silane. For example, the oxide surface may be contacted with a silane having the general formula $(R^I)_3SiA$, wherein $R^I$ is a linear or branched C1-C5 alkyl group or a linear or branched C1-C4 alkyl group, and A is any ligand which is reactive with a silicon containing surface.

The silylation agent may be provided to the reaction chamber holding the substrate in a single pulse or in a sequence of multiple pulses. In some embodiments the silylation agent is provided in a single long pulse or in multiple shorter pulses. The pulses may be provided sequentially. In some embodiments the silylation agent is provided in 1 to 25 pulses of from about 0.1 to about 60 seconds. In between pulses, the silylation agent may be removed from the reaction space. For example, the reaction chamber may be evacuated and/or purged with an inert gas. The purge may be, for example for about 1 to 30 seconds or more.

In some embodiments, the temperature of the silylation process may be, for example, from about 50 to 500° C., or about 100 to about 300° C. The pressure during the silylation process may be, for example, from about $10^{-5}$ to about 760 Torr, or in some embodiments from about 1 to 10 Torr or about 0.1 to about 10 Torr.

In some embodiments, the silylation process may be carried out in situ, that is in the same reaction chamber as a subsequent deposition process, for example selective deposition of a metal oxide, such as aluminum oxide, on the non-silylated surface relative to the silylated surface. However, in some embodiments the silylation may be carried out in a separate reaction chamber. In some embodiments the reaction chamber in which the silylation is carried out is part of a cluster tool, including one or more additional reaction chambers. For example, such a cluster tool may include additional reaction chambers for the deposition of the metal oxide, and/or for etching one or more layers. In some embodiments a cluster tool includes separate modules for pretreatment, silylation of the oxide surface, selective deposition of a metal oxide and subsequent post-deposition treatment, such as etching or plasma post-deposition cleaning. In some embodiments the same module can be used for two or more processes.

In some embodiments, the substrate may be pretreated or cleaned prior to or at the beginning of the passivation and/or selective deposition processes. In some embodiments, the substrate may be subjected to a plasma cleaning process prior to or at the beginning of the selective passivation and/or selective deposition processes. In some embodiments, a plasma cleaning process may not include ion bombardment, or may include relatively small amounts of ion bombardment. In some embodiments the substrate surfaces may be exposed to plasma, radicals, excited species, and/or atomic species prior to or at the beginning of the passivation process, and/or the selective metal oxide deposition process. In some embodiments, the substrate surface may be exposed to hydrogen plasma, radicals, or atomic species prior to or at the beginning of the selective passivation process and/or the selective metal oxide deposition process.

Selective Deposition of Metal Oxide on Metal or Metallic Surfaces Relative to Passivated Oxide Surfaces Metal oxide can be selectively deposited on a metal or metallic surface of a substrate relative to a passivated oxide surface of the substrate. After selectively forming a passivation layer on the oxide surface, in some embodiments a metal oxide is selectively deposited on the second surface by contacting the substrate alternately and sequentially with a first reactant comprising a metal of the metal oxide and a second reactant comprising oxygen. In some embodiments, the second reactant is water. In some embodiments the substrate is contacted sequentially with the first and second reactants, such that metal oxide is selectively deposited on or over the metal or metallic surface (see, e.g., FIGS. 1A-1D).

In some embodiments the metal reactant is a hydrophobic reactant, comprising one or more hydrophobic ligands. In some embodiments, the hydrophobic reactant comprises two to four hydrophobic ligands. In the case of hydrophobic reactants comprising a metal with a valence/oxidation state of n, in some embodiments, the hydrophobic precursor comprises n–1 or n–2 hydrophobic ligands.

In some embodiments, at least one hydrophobic ligand comprises only C and H. In some embodiments, at least one hydrophobic ligand comprises C, H and Si or Ge, but no additional elements.

In some embodiments, a hydrocarbon ligand comprises one or more of the following:
    C1-C10 hydrocarbon (single, double or triple bonded)
        Alkyls
            C1-C5 alkyls
                Me, Et, Pr, $^i$Pr, Bu, $^t$Bu
        Alkenyls
            C1-C6 alkenyls
        Cyclic hydrocarbons
            C3-C8
                Cyclopentadienyl
                Cycloheptadienyl
                Cycloheptatrienyl
                Cyclohexyl
                Derivatives of those
        Aromatic
            C6 aromatic ring and derivatives of those In some embodiments, a hydrophobic metal reactant comprises no hydrophilic ligands. However, in some embodiments the hydrophobic metal reactant may comprise one or two hydrophilic ligands. In some embodiments, a hydrophilic ligand comprises nitrogen, oxygen and/or a halogen group.

In some embodiments, a hydrophilic ligand is an alkylamine (—$NR_2$, where each R can be alkyl, hydrogen). In some embodiments, the hydrophilic ligand can be —$NMe_2$, —NEtMe, or —$NEt_2$.

In some embodiments, a hydrophilic ligand is an alkoxide, for example —OMe, —OEt, —O$^i$Pr, —O$^t$Bu.

In some embodiments, a hydrophilic ligand comprises a halide, such as a chloride, fluoride or other halide.

In some embodiments, a hydrophobic precursor comprises the formula:

$L_nMX_y$, in which

In some embodiments n is from 1-6;
 In some embodiments n is from 1-4 or 3-4.
In some embodiments y is from 0-2;
 In some embodiments y is from 0-1.
L is a hydrophobic ligand;
 In some embodiments L is Cp or a C1-C4 alkyl ligand.
X is hydrophilic ligand;
 In some embodiments X is an alkylamine, alkoxide or halide ligand.
M is metal (including group 13 elements, B, and Ga);
 In some embodiments M has an oxidation state of +I up to +VI.
  In some embodiments M has an oxidation state of +IV to +V.
 In some embodiments M can be a transition metal.
  In some embodiments M is Ti, Ta, Nb, W, Mo, Hf, Zr, V, or Cr.
   In some embodiments M is Hf, Zr, Ta or Nb.
    In some embodiments M is Zr.
 In some embodiments M is Co, Fe, Ni, Cu, or Zn.
  In some embodiments the metal is not W or Mo.
 In some embodiments M can be a rare earth metal.
  In some embodiments M is La, Ce, or Y.
 In some embodiments M can be a metal from groups of 2-13.
  In some embodiments M is Ba, Sr, Mg, Ca, or Sc.
  In some embodiments M is not a noble metal.

More generally, in some embodiments, a selective ALD process employs a metal precursor. In some embodiments, the metal of the metal precursor may be selected from the group comprising Al, Ti, Ta, Nb, W, Mo, Hf, Zr, V, Cr, Co, Fe, Ni, Cu, Zn, La, Ce, Y, Ba, Sr, Mg, Ca, or Sc, or mixtures thereof. In some embodiments, the metal may be Al.

In some embodiments, aluminum oxide is selectively deposited and the selective ALD process employs an Al precursor. Examples of Al precursors include trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA) or triethyl aluminum (TEA). In some embodiments the aluminum precursor is a heteroleptic aluminum compound. In some embodiments the heteroleptic aluminum compound comprises an alkyl group and another ligand, such as a halide, for example Cl. In some embodiments the aluminum compound is dimethylaluminumchloride. In some embodiments the aluminum precursor is an alkyl precursor comprising two different alkyl groups as ligands. In some embodiments the aluminum precursor is a metalorganic compound. In some embodiments the aluminum precursor is an organometallic compound.

In some embodiments, zirconium oxide is selectively deposited using Bis(methylcyclopentadienyl) methoxymethyl zirconium (IV) (($CpMe)_2$-Zr—(OMe)Me).

In some embodiments, hafnium oxide is deposited using bis(methylcyclopentadienyl) methoxymethyl hafnium (IV) (($CpMe)_2$-Hf—(OMe)Me).

In some embodiments, the second reactant contributes one or more elements to the material that is selectively deposited. For example, the second reactant can be an oxygen precursor used to deposit a metal oxide.

In some embodiments, the second reactant comprises an oxygen precursor. In some embodiments, the second reactant comprises $H_2O$, $O_3$, $H_2O_2$, oxygen plasma, ions, radicals, atomic O or excited species of oxygen.

In some embodiments, other reactants can be utilized that contribute elements other than O to the deposited material. These reactants may be used in addition to a second oxygen reactant, or may themselves serve as a second reactant and contribute oxygen and another element to the deposited film. For example, in some embodiments a nitrogen reactant can be used to contribute nitrogen, a sulfur reactant may be used to contribute sulfur, a carbon reactant may be used to contribute carbon or a silicon reactant may be used to contribute silicon.

In some embodiments a metal oxide thin film, such as aluminum oxide (e.g., $Al_2O_3$) is selectively deposited on one or more metal or metallic surfaces, such as a copper, cobalt, titanium nitride or tungsten surfaces, relative to one or more oxide surfaces. In a first step, a substrate comprising the metal surface and the oxide surface is treated to form a passivation layer on the oxide surface by silylation, as described above. For example, in some embodiments the substrate surface(s) may be exposed to a silylating agent, such as allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA), which selectively silylates the oxide surface(s). Following formation of the passivation layer on the oxide surface a metal oxide is selectively deposited on the metal or metallic surface relative to the passivated oxide surfaces by a vapor deposition process. Selective deposition may be as described herein. For example, in some embodiments aluminum oxide is selectively deposited by alternately and sequentially contacting the substrate with an aluminum reactant and an oxygen precursor. The aluminum reactant may comprise, for example, trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA) or triethyl aluminum (TEA). The oxygen precursor may comprise, for example, water. In some embodiments aluminum oxide may be deposited by an atomic layer deposition process in which the substrate is alternately and sequentially contacted with an aluminum reactant and water. In some embodiments the temperature in the reaction chamber during aluminum oxide deposition is from about 150 to about 350° C. In some embodiments the pulse time for the reactants may be from about 0.1 to about 10 seconds, and the purge time between reactant pulses may also be from about 0.1 to about 10 seconds. In some embodiments the reaction chamber pressure may be, for example, from about $10^{-5}$ to about 760 Torr, or in some embodiments from about 1 to 10 Torr.

Following selective deposition of the metal oxide, the substrate may be subjected to a post-deposition cleaning step to remove the passivation layer from the oxide surfaces, as mentioned above. In some embodiments the cleaning step may comprise $H_2$ plasma treatment. In some embodiments the cleaning step is carried out at a temperature of about room temperature to about 400° C. In some embodiments plasma power of about 25 to 250 W may be used to generate a plasma in flowing $H_2$, for example at a flow rate of about 10 to 500 sccm. The clean time after deposition of the metal oxide layer may be, for example, from about 0.1 to 600 seconds or more in some embodiments.

In some embodiments a thin metal oxide film, such as aluminum oxide (e.g., $Al_2O_3$) is selectively deposited on a metal or metallic surface of a three-dimensional structure relative to one or more passivated oxide surfaces. The three-dimensional structure may comprise, for example, a via or a trench. In some embodiments oxide surfaces may be selectively passivated prior to depositing the metal oxide film. Vapor deposition is then carried out to deposit the metal oxide on the metal surfaces that are not passivated.

Passivation Blocking Layer

A passivation blocking layer can facilitate selective formation of a passivation layer on dielectric material relative to the passivation blocking layer. As noted above, a self-assembled monolayer (SAM) can serve to inhibit silylation of a metal or metallic surface, thus facilitating selective passivation of dielectric surfaces. The term "blocking" is thus merely a label and need not imply 100% deactivation of the organic passivation layer deposition. As noted elsewhere herein, even imperfect selectivity can suffice to obtain a fully selective structure after an etch back process.

Selectivity

Selective passivation and/or selective deposition can be fully selective or partially selective. A partially selective process can be followed by a post-deposition etch that removes all of the deposited material from over one surface without removing all of the deposited material from over a second surface, resulting in a fully selective layer. Thus, in some embodiments the selective deposition need not be fully selective in order to obtain the desired benefits.

Selectivity of deposition (or passivation) on a first surface, here referred to as surface A, relative to a second surface, referred to as surface B, can be given as a percentage calculated by [(deposition on surface A)−(deposition on surface B)]/(deposition on the surface A). Deposition can be measured in any of a variety of ways. For example, deposition may be given as the measured thickness of the deposited material, or may be given as the measured amount of material deposited. In embodiments described herein, an oxide surface (A) can be selectively passivated relative to a metal or metallic surface (B). With respect to passivation, if the passivation results from treatment of the substrate surface rather than deposition of a layer, the amount of passivation can be a measure of available reactive sites on the substrate surface that have reacted with the passivating agent. Subsequently, a metal oxide layer can be selectively deposited on the metal or metallic surface (B) relative to the passivation layer over the oxide surface (A).

In some embodiments, selectivity for the selective formation of the passivation layer on an oxide surface (relative to a metal or metallic surface) is greater than about 10%, greater than about 50%, greater than about 75%, greater than about 85%, greater than about 90%, greater than about 93%, greater than about 95%, greater than about 98%, greater than about 99% or even greater than about 99.5%.

In some embodiments, selectivity of deposition of a metal oxide on the metal or metallic surface (relative to the passivated oxide surface) is greater than about 10%, greater than about 50%, greater than about 75%, greater than about 85%, greater than about 90%, greater than about 93%, greater than about 95%, greater than about 98%, greater than about 99% or even greater than about 99.5%.

In some embodiments, deposition only occurs on one surface and does not occur on the other surface.

In some embodiments, passivation of an oxide surface by silylation relative to a metal or metallic surface of the substrate is at least about 80% selective. In some embodiments, the passivation process is at least about 50% selective. In some embodiments the passivation process is at least about 10% selective. The skilled artisan will appreciate that a partially selective process can result in a fully selective passivation of the oxide surface by a post-deposition etch that removes any silylation from the metal or metallic surface.

In some embodiments, deposition of a metal oxide on a metal or metallic surface of the substrate relative to a silylated oxide surface of the substrate is at least about 80% selective. In some embodiments, deposition of a metal oxide on a metal or metallic surface of the substrate relative to a silylated oxide surface of the substrate is at least about 50% selective. In some embodiments deposition of a metal oxide on a metal or metallic surface of the substrate relative to a silylated oxide surface of the substrate is at least about 10% selective. The skilled artisan will appreciate that a partially selective process can be followed by a post-deposition etch (or other treatment) that removes substantially all of the deposited material from over the silylated oxide surface. Furthermore, the post-deposition treatment can also aid in tailoring the position and/or profile of the selectively deposited layer.

Selective Deposition of Metal Oxide on Metal or Metallic Surfaces

FIGS. 1A-1D schematically illustrate an embodiment for selective passivation of a first oxide surface relative to a second metal or metallic surface, followed by selective deposition of metal oxide on the second metal or metallic surface relative to the passivated first oxide surface.

Figure 1A:
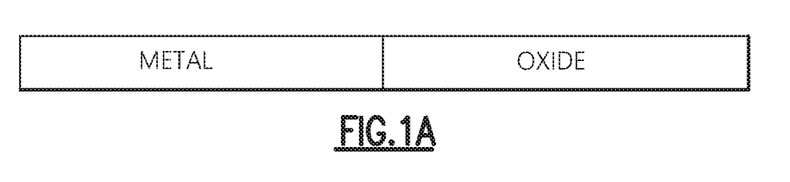
FIG. 1A is a schematic cross section of a portion of a substrate having first metal surface and a second adjacent oxide surface, in accordance with a first embodiment.

FIG. 1A illustrates a substrate having materially different surfaces exposed. For example, the first surface can comprise or be defined by a metal, such as cobalt (Co), copper (Cu), tungsten (W) or molybdenum (Mo). The second surface can comprise or be defined by an oxide, such as a silicon oxide-based layer or a silicon surface having native oxide formed thereover.

Figure 1B:
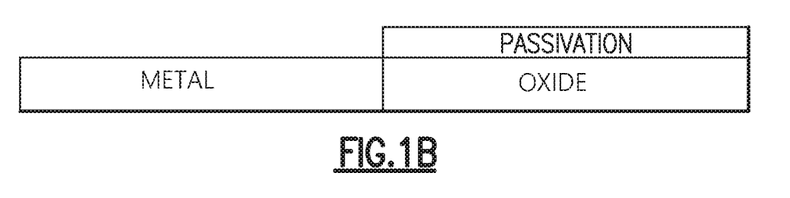
FIG. 1B is a schematic cross section of the substrate of FIG. 1A after a selective passivation of the oxide surface.

FIG. 1B shows the substrate of FIG. 1A after selective passivation of the oxide surface, such as by silylation. For example, a passivation layer may be formed selectively on the oxide surface by exposing the substrate to a silylating agent, such as allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA).

Figure 1C:
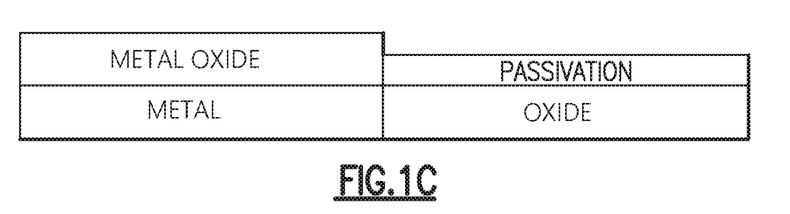
FIG. 1C is a schematic cross section of the substrate of FIG. 1B after selective deposition of metal oxide on the metal surface.

FIG. 1C shows the substrate of FIG. 1B following selective deposition of a metal oxide on the metal surface relative to the passivation layer on the oxide surface. The metal oxide can be, for example, a metal oxide such as aluminum oxide, zirconium oxide, hafnium oxide, titanium oxide, tantalum oxide, yttrium oxide, lanthanum oxide, or other transition metal oxide or mixtures thereof. In some embodiments the metal oxide is aluminum oxide. In some embodiments the metal oxide is selectively deposited by a vapor deposition process, such as an atomic layer deposition process. In some ALD processes for selective deposition of the metal oxide the substrate is alternately and sequentially contacted with a metal reactant and an oxygen reactant. For example, aluminum oxide may be selectively deposited on the metal or metallic surface relative to the passivated surface by an ALD process comprising alternately and sequentially contacting the substrate with an aluminum reactant, such as trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA) or triethyl aluminum (TEA), and an oxygen reactant, such as water.

As noted above, any metal oxide deposited on the passivation layer can be removed by a post deposition treatment, such as an etch back process. Because the metal oxide is deposited selectively on the metal surface, any metal oxide left on the passivation surface will be thinner than the metal oxide formed on the metal surface. Accordingly, the post deposition treatment can be controlled to remove all of the metal oxide over the surface comprising the passivation layer without removing all of the metal oxide from over the metal surface. Repeated selective deposition and etching back in this manner can result in an increasing thickness of the metal oxide on the metal surface with each cycle of deposition and etch. Repeated selective deposition and etching back in this manner can also result in increased overall selectivity of the metal oxide on the metal or metallic surface, as each cycle of deposition and etch leaves a clean passivation layer over which the selective metal oxide deposition nucleates poorly. In other embodiments, metal oxide material can be removed during subsequent removal of the passivation layer. For example, either a direct etch or a lift-off method can be used to remove metal oxide from the passivation layer surface in a cyclical selective deposition and removal.

Figure 1D:
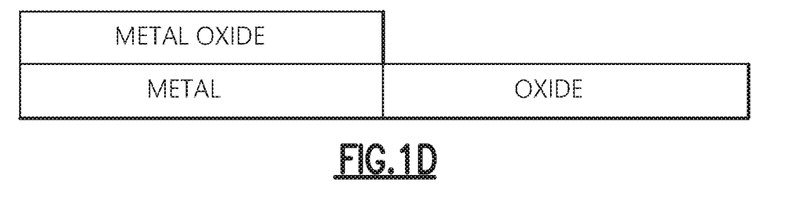
FIG. 1D is a schematic cross section of the substrate of FIG. 1C after removal of the passivation material from the oxide surface.

FIG. 1D shows the substrate of FIG. 1C after a post deposition treatment to remove the passivation layer from the oxide surface, such as by an etch process. In some embodiments, the etch process may comprise exposing the substrate to a plasma. In some embodiments, the plasma may comprise oxygen atoms, oxygen radicals, oxygen plasma, or combinations thereof. In some embodiments, the plasma may comprise hydrogen atoms, hydrogen radicals, hydrogen plasma, or combinations thereof. In some embodiments, the plasma may comprise noble gas species, for example Ar or He species. In some embodiments the plasma may consist essentially of noble gas species. In some instances, the plasma may comprise other species, for example nitrogen atoms, nitrogen radicals, nitrogen plasma, or combinations thereof. In some embodiments, the etch process may comprise exposing the substrate to an etchant comprising oxygen, for example $O_3$. In some embodiments, the substrate may be exposed to an etchant at a temperature of between about 30° C. and about 500° C., or between about 100° C. and about 400° C. In some embodiments, the etchant may be supplied in one continuous pulse or may be supplied in multiple pulses. As noted above, the passivation layer removal can be used to lift-off any remaining metal oxide from over the oxide layer, either in a complete removal of the passivation layer or in a partial removal of the passivation layer in a cyclical selective deposition and removal.

Additional treatments, such as heat or chemical treatment, can be conducted prior to, after or between the foregoing processes. For example, treatments may modify the surfaces or remove portions of the metal, silicon oxide, passivation and metal oxide surfaces exposed at various stages of the process. In some embodiments the substrate may be pre-treated or cleaned prior to or at the beginning of the process. In some embodiments, the substrate may be subjected to a plasma cleaning process, as mentioned above.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A method of selectively depositing a metal oxide on a metal surface of a substrate relative to a transition metal oxide surface of the substrate, wherein the metal surface is an Al, Cu, Co, Ni, W, Nb, Fe, or Mo surface, the method comprising, in order:
   forming a passivation blocking layer on the metal surface;
   selectively passivating the transition metal oxide surface relative to the metal surface, wherein selectively passivating the transition metal oxide surface comprises exposing the transition metal oxide surface to a silylation agent;
   removing the passivation blocking layer from the metal surface; and
   selectively depositing the metal oxide from vapor phase reactants on the metal surface relative to the passivated transition metal oxide surface,
   wherein the vapor phase reactants comprise a hydrophobic metal reactant comprising one or more hydrophobic ligands, and
   wherein at least one of the hydrophobic ligands comprises C.

2. The method of claim 1, wherein the silylation agent comprises allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA).

3. The method of claim 1, wherein the silylation agent comprises an alkylaminosilane.

4. The method of claim 3, wherein the alkylaminosilane has a formula $(R^I)_3Si(NR^{II}R^{III})$, wherein $R^I$ is a linear or branched C1-C5 alkyl group, $R^{II}$ is hydrogen or a linear or branched C1-C5 alkyl group, and $R^{III}$ is a linear or branched C1-C5 alkyl group.

5. The method of claim 1, wherein the silylation agent comprises a silane.

6. The method of claim 5, wherein the silane has a general formula $(R^I)_3SiA$, wherein $R^I$ a linear or branched C1-C5 alkyl group, and A is any ligand which is reactive with a silicon containing surface.

7. The method of claim 1, wherein the metal oxide comprises a dielectric transition metal oxide.

8. The method of claim 1, wherein the metal oxide comprises aluminum oxide, zirconium oxide, hafnium oxide, titanium oxide, tantalum oxide, yttrium oxide, lanthanum oxide, or other transition metal oxide or mixtures thereof.

9. The method of claim 8, wherein the metal oxide comprises aluminum oxide.

10. The method of claim 9, wherein the aluminum oxide is deposited using an aluminum precursor comprising trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA) or triethyl aluminum (TEA).

11. The method of claim 10, wherein the aluminum oxide is deposited using an aluminum precursor comprising dimethylaluminum isopropoxide (DMAI).

12. The method of claim 9, wherein the aluminum oxide is deposited using an aluminum precursor comprising a heteroleptic aluminum compound comprising an alkyl group and a different ligand.

13. The method of claim 12, wherein the different ligand is a halide.

14. The method of claim 9, wherein the aluminum oxide is deposited using an aluminum precursor comprising an aluminum alkyl compound comprising two different alkyl groups as ligands.

15. The method of claim 9, wherein the aluminum oxide is deposited using an aluminum precursor comprising a metalorganic aluminum compound or an organometallic aluminum compound.

16. The method of claim 9, wherein the aluminum oxide is deposited by an ALD process comprising alternately and sequentially contacting the substrate with a first reactant comprising trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA) or triethyl aluminum (TEA) and a second reactant comprising water.

17. The method of claim 1, wherein the metal oxide is selectively deposited by an atomic layer deposition (ALD) process.

18. The method of claim 17, wherein the ALD process comprises alternately and sequentially contacting the substrate with the hydrophobic metal reactant and a second oxygen reactant.

19. The method of claim 1, wherein the passivation blocking layer comprises a self-assembled monolayer (SAM).

20. The method of claim 1, wherein the at least one of the hydrophobic ligands consists of C and H.

* * * * *